May 11, 1971 I. A. LESK 3,578,514

METHOD FOR MAKING PASSIVATED FIELD-EFFECT TRANSISTOR

Filed July 9, 1967 3 Sheets-Sheet 1

INVENTOR.
Israel Arnold Lesk

BY Mueller & Aichele

ATT'YS.

INVENTOR.
Israel Arnold Lesk

BY Mueller & Aichele

ATT'YS.

INVENTOR.
Israel Arnold Lesk
BY Mueller & Aichele
ATT'YS.

United States Patent Office 3,578,514
Patented May 11, 1971

3,578,514
METHOD FOR MAKING PASSIVATED FIELD-EFFECT TRANSISTOR

Israel Arnold Lesk, Scottsdale, Ariz., assignor to Motorola, Inc., Franklin Park, Ill.

Continuation-in-part of abandoned application Ser. No. 368,212, May 18, 1964. This application July 9, 1967, Ser. No. 655,265
Int. Cl. H01l 7/36, 3/00; B01j
U.S. Cl. 148—175 5 Claims

ABSTRACT OF THE DISCLOSURE

A method of making a field effect transistor in a semiconductor wafer of one conductivity type semiconductor material which includes initially forming an epitaxial layer of opposite conductivity type semiconductor material on the surface of the wafer to form a first gate PN junction. The epitaxial layer is then coated with a film of diffusion resistant material, and a portion of this film is removed to expose a selected area of the epitaxial layer. An impurity of one conductivity type semiconductor material is then diffused through the exposed area of the epitaxial layer and into the epitaxial layer to a depth less than the first PN junction to thereby form a second gate region of the field effect transistor. This gate region divides the epitaxial layer into source, drain and channel regions of opposite conductivity type semiconductor material. The relatively high resistivity epitaxial channel provides a high gain characteristic and the step of diffusing the second gate provides excellent channel width control.

This application is a continuation-in-part of U.S. Ser. No. 368,212, filed May 18, 1964 entitled "Passivated Field-Effect Transistor," now abandoned.

This invention relates to the semiconductor art and in particular to the method of making field effect transistors and field effect current limiters.

BACKGROUND OF THE INVENTION

State-of-the-art field effect transistors and current limiters are low current devices, and it is therefore necessary that the leakage currents of these devices be very low and stable. Since the PN junctions which form the gates are ordinarily reverse biased, it is desirable that these junctions be able to sustain considerable voltage without going into avalanche breakdown. This characteristic of field effect devices permits the devices to be utilized over a wider range of voltage than an otherwise equivalent device having a lower breakdown. Prior art field effect transistors and current limiters have exhibited neither high avalanche breakdown voltage nor the requisite low leakage and stability and were never widely used for these reasons.

SUMMARY OF THE INVENTION

It is, therefore, an object of this invention to provide a method of making a field-effect device which has a considerably higher avalanche breakdown and lower leakage than prior art field-effect devices and is in addition quite stable in its characteristics.

This invention features the construction of a channel of epitaxial semiconductor material of a high resistivity thereby providing a channel-to-gate junction characterized by an avalanche breakdown voltage which is substantially higher than that of prior art devices.

Another feature of this invention is the construction of a field-effect device using selective solid state diffusion methods to establish gate, source, and drain configurations for the device so that the device is substantially more reproducible and easier to manufacture to a given specification than are prior art field-effect devices.

Yet another feature of this invention is the construction of passivating oxide on gate PN junctions where these junctions come to the surface.

Briefly described, the method of making field-effect devices according to this invention includes initially providing a semiconductor wafer of one conductivity type and thereafter epitaxially growing a semiconductor layer of opposite conductivity type on the wafer to form a first PN junction. The epitaxial layer is a relatively high resistivity semiconductor material and forms the channel of the junction field-effect device being constructed. Thereafter, using selective diffusion techniques, a top gate region is formed by diffusing an impurity of the one conductivity type into the epitaxial layer at a depth less than the thickness of the epitaxial layer, thereby dividing the epitaxial layer into a source, drain and channel portions. The wafer of the one conductivity type forms the lower gate of the field-effect device and the top gate is formed by the diffused region, also of the one conductivity type semiconductor material. Since the epitaxial channel is a relatively high resistivity material, a wide depletion spread and high gain are obtained for relatively low values of gate voltage.

DETAILED DESCRIPTION OF THE DRAWINGS

Figure 1:
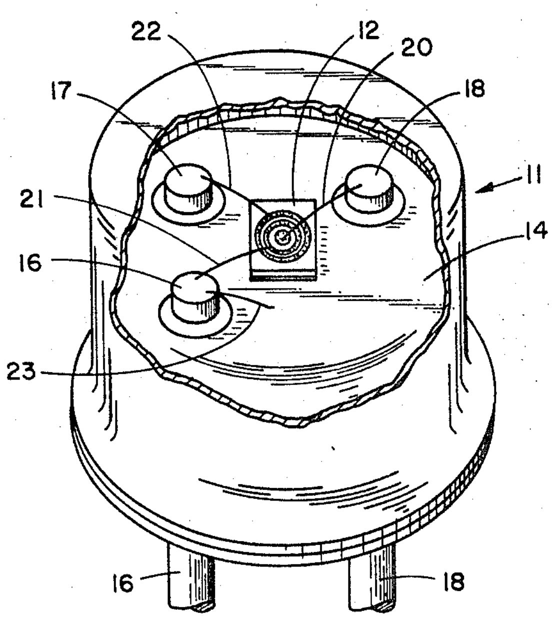
FIG. 1 is a field effect transistor with a portion of the enclosure cut away to show the detail within the enclosure.

The field-effect transistor 11 shown in cutaway view in FIG. 1 is comprised of a semiconductor unit 12 which has been soldered to a header 14 and is adapted for connecting into a circuit outside the enclosure by the leads 16, 17 and 18. These leads are connected to the metallized portion of the semiconductor unit 12 by tiny wires 20, 21 and 22. These tiny wires are thermocompression bonded to the semiconductor unit 12 and to the tops of the header leads 16, 17 and 18. The lead 16 is for biasing the two gate regions (shown in subsequent drawings) of the semiconductor unit 12 and is shorted to the header, with the wire 21 providing a connection to one gate while the wire 23 provides connection by way of the header 14 to the other gate.

Figure 2:
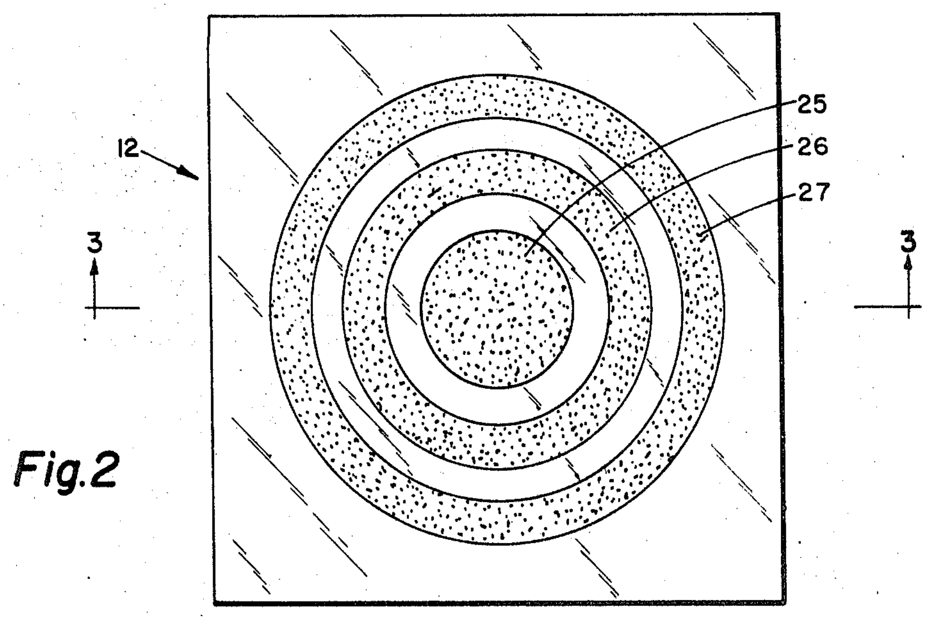
FIG. 2 is a plan view of the passivated semiconductor unit of the field effect transistor.

In the enlarged drawing of the semiconductor unit 12 (FIGS. 2 and 3) are shown the metal electrodes 25, 26 and 27 to which the tiny wires 20, 21 and 22 of FIG. 1 are thermocompression bonded. The drain electrode 25 is the disk of thin film aluminum which provides the contact to the underlying drain region 30 of the device. The ring of the thin film aluminum just outside the drain electrode is the top gate electrode 26 which provides electrical contact to the underlying top gate region 31 of the device, and the outermost metal ring is the source electrode 27 which provides a contact to the underlying N type material of the source region 32 of the device. Note that there are N+ regions 35 and 36 immediately beneath the source electrode 27 and the drain electrode 25. These N+ regions (which are called enhancement layers) are provided to prevent aluminum in the electrodes from converting the surface of the high resistivity N type source 32 and drain 30 regions to P conductivity type since aluminum is P conductivity type dopant. The concentration of N type material in these N+ regions is sufficiently high to prevent the formation of any P type regions due to compensation.

The P type material 40 surrounding the N regions of the device is the lower gate region and forms a PN junction 41 with the N regions. The PN junction runs from the surface of the device and beneath the source 32, channel 33 and drain 30 regions. Only a small portion of the large PN junction serves as the lower gate 43, that region being that part of the PN junction which lies immediately beneath the upper PN gate region 31. The metallized region 44 is the lower gate electrode which provides electrical contact to the lower gate region 40 and is of gold so that during manufacture the semiconductor unit may be readily soldered to the header.

To provide a device of improved stability and low leakage, the semiconductor unit is passivated, i.e., the PN junctions where these junctions extend to the surface as at the regions 45, 46 and 47 are covered with a film 48 of silicon dioxide or a glass having good dielectric characteristics. This greatly reduces the intensity of the fringing electrical field at the free surface of the device. With the fringing electric field at the free surface reduced, the surface leakage is much less, and the tendency for polar and ionic surface contaminants to migrate and accumulate so as to cause unstable states is greatly reduced, resulting in a more stable device.

Since all PN junctions of the semiconductor unit 12 terminate at the surface of the silicon pellet beneath the protecting dielectric oxide layer, impurities that can cause high leakage and instability are kept away from the PN junctions by the thickness of the oxide layer, whereas on an unpassivated all-diffused structure they can settle directly onto the PN junctions where they are exposed at the surface. Impurities on the surface can move under the influence of the junction fringing field and this field is reduced in strength very quickly with distance from the PN junction. Hence, impurities on top of the oxide of a passivated device experience a much smaller electric field than those on the exposed junction of a non-passivated device. They thus have a less deleterious effect on leakage current, and because their motion is much reduced in the lower electric field, reliability is enhanced.

The upper gate region is formed by selective solid state diffusion. The PN gate junction 49 formed by this region is almost as deep as the PN gate junction 43 so that the channel 33 is quite thin. As will be described below in further detail and in accordance with this invention, it is highly desirable to combine epitaxial channel growth and subsequent gate diffusion into the channel in order to obtain excellent channel width control.

The voltage at which avalanche breakdown occurs depends upon the resistivity of the semiconductor material on both sides of the PN junction and, neglecting extra causes, avalanche breakdown will occur in that part of a PN junction where the resistivity is the lowest. In the more recent prior art field effect devices which have an all-diffused structure in a wafer substrate, one conductivity region which forms the source, drain and channel portions of the device is selectively diffused in from one of the wafer faces to a given depth and then another opposite conductivity type region is diffused in from the same face to a lesser depth to form a PN gate junction. This junction extends from the surface of the device. The surface concentrations of impurity of both of these diffused regions are quite high and so exhibit quite low resistivities on both sides of the junction there. The surface region of the PN gate junction, therefore, will have a breakdown which is rather low. However, in a device in which the semiconductor unit has been prepared in accordance with this invention, the epitaxial region adjacent the diffused region is of a quite high resistivity at the surface, and the avalanche breakdown at the surface of the PN junction is therefore substantially higher than is the case with the all-diffused structure.

The process according to the present invention will be discussed in more detail below with reference to Steps A through K of FIGS. 4A to 4K. The individual steps described below are widely known in the semiconductor industry.

Figure 3:
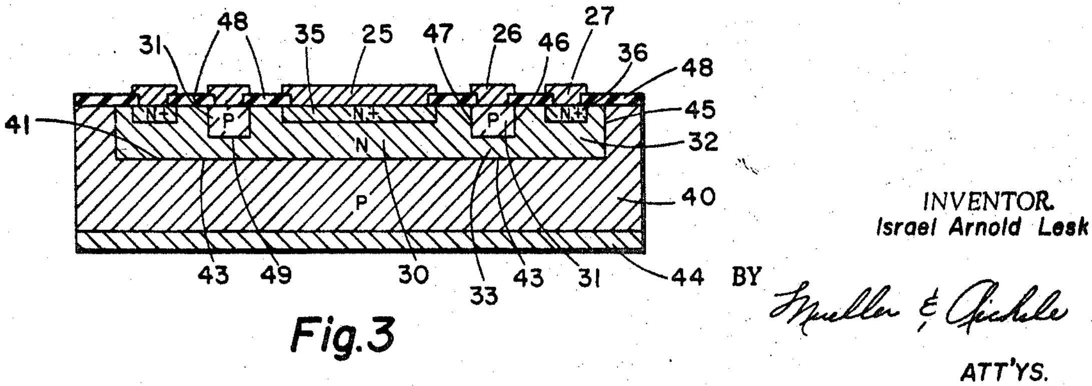
FIG. 3 is a cross-sectional view of FIG. 2 taken at line 3—3.

A wafer 40' (Step A, FIG. 4A) which may, for example, be in the order of 1 ohm-centimeter P type silicon is etched to provide a smooth surface which is substantially free of surface damage. In the next step (FIG. 4B), a film of N type epitaxial silicon 34' is grown across the surface of the P type wafer 40' to a thickness of about 5 microns. In the next step (FIG. 4C), a film of silicon dioxide 53 is grown across both faces of the wafer to a thickness of about 10,000 angstrom units. In the next step (FIG. 4D) a portion of this silicon dioxide film on the N face is etched away to leave a circular region 55 of silicon dioxide which acts as a diffusion mask for the next step. In the next step (FIG. 4E), the impurity boron is diffused into the silicon not covered by the silicon dioxide to form a P region 58 which extends into the silicon so that the remaining N type region 32' is circular in form. The P type region 58 joins the P wafer 40' to form the lower gate region 40 (FIG. 3). During this operation a film 60 of borosilicate glass is formed which covers the silicon dioxide film 55 as well as the other portions of the wafer. A circular ring of borosilicate glass and silicon dioxide is then etched away in Step 4F to form a ring-shaped opening 62 in preparation for a subsequent diffusion step.

Figure 4A:
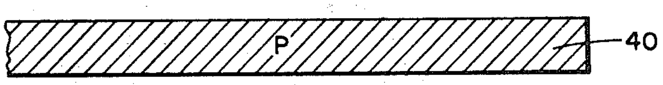
FIGS. 4A to 4K are illustrations to show the sequence of steps used in making the field-effect transistor active unit.
Figure 4B:
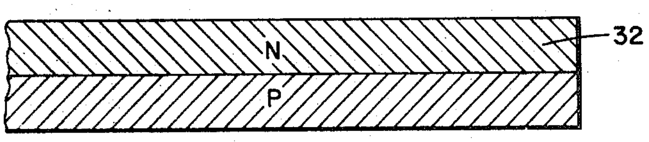
Figure 4C:
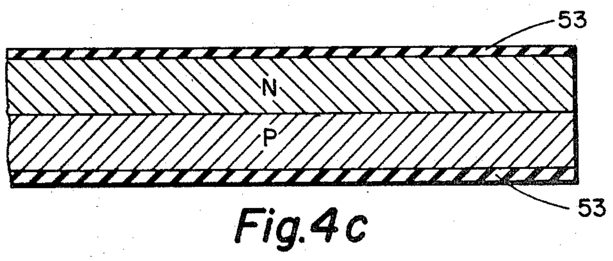
Figure 4D:
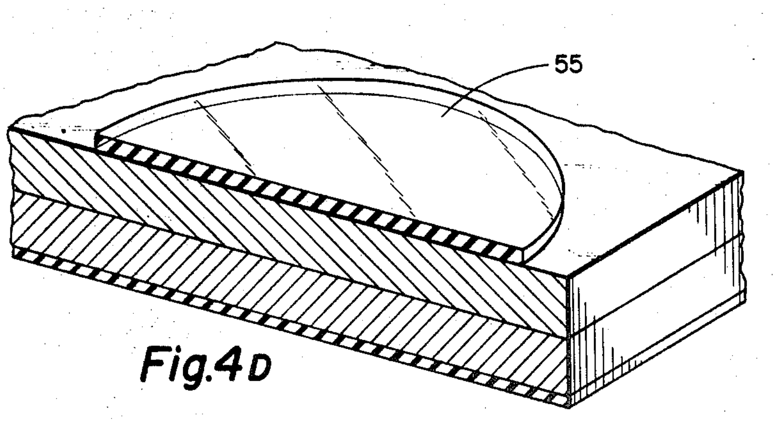
Figure 4E:
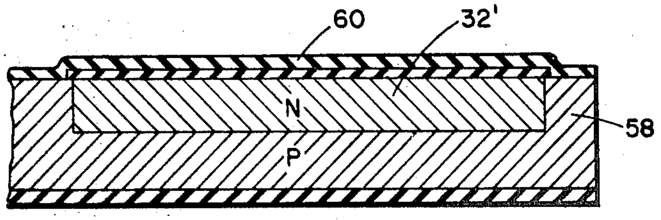
Figure 4F:
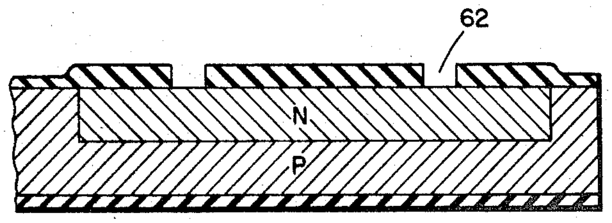
Figure 4G:
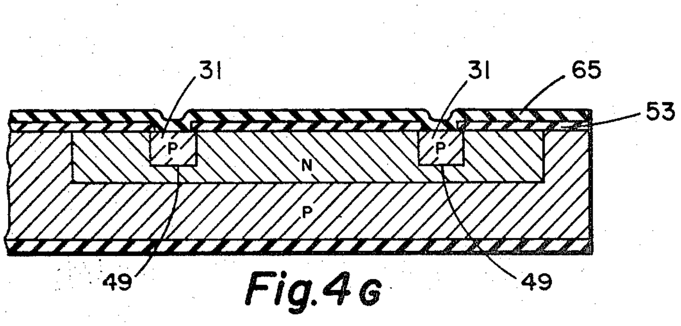
Figure 4H:
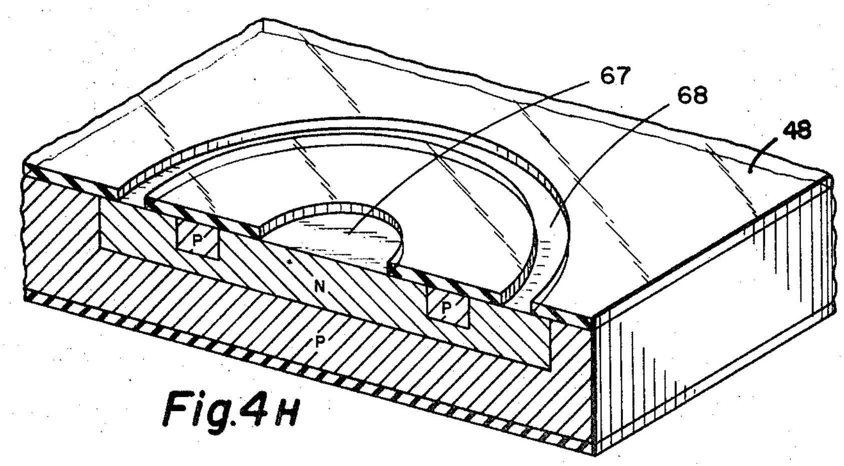
Figure 4I:
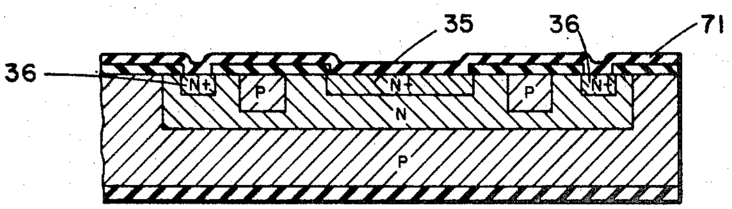

The PN gate junction 49 is formed (FIG. 4G) at a depth of about 3 microns and this region has a surface concentration of about $10^{20}$ boron atoms per cubic centimeter. During this step a second borosilicate glass film 65 is formed over the initial film of silicon dioxide 55 and the first film of borosilicate glass 60. These films are represented by the single layer 48 (FIG. 4H). In the next step (Step 4H), a disk of oxide and a ring of oxide lying outside of the outer boundary of the gate region are removed to form the openings 67 and 68 in preparation for the next diffusion step.

Figure 4J:
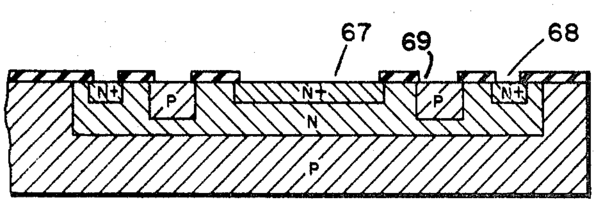
Figure 4K:
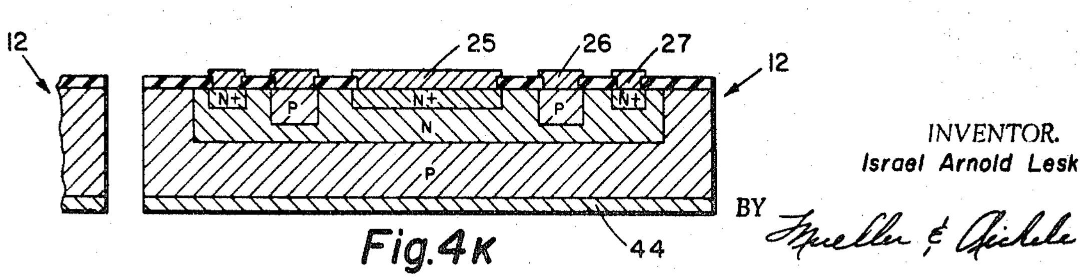

In the next diffusion step (FIG. 4I), thin enhancement regions 35 and 36 of N+ material are formed by diffusing phosphorus into the underlying N region. During this step a very thin phosphosilicate glass film 71 is formed over the exposed portions of the silicon and films of silicon dioxide and borosilicate glass. The wafer is then lightly etched to remove this phosphosilicate glass to clean the openings 67 and 68, and a ring of oxide is removed over the upper gate region 31 to form an opening 69, as shown in FIG. 4J. Then a film of aluminum is evaporated over the wafer (FIG. 4K) and this film is then etched to a desired configuration to form the electrodes 25, 26 and 27 to the source, gate and drain. Next, a film of gold 44 is deposited on the opposite side of the wafer.

The wafer is then cut into a number of discrete semiconductor units 12, each of which is mounted on the header by soldering. The source electrode 27, drain electrode 25 and top gate electrode 26 are then connected to the header leads 16, 17 and 18 (FIG. 1) by thermocompression bonding of wires 20, 21 and 22. The cap which encloses the semiconductor unit forms a hermetic seal with the header to which it is welded. The device is considered completed after it has been electrically tested and classified according to its parameters.

Selective solid state diffusion techniques that are used in the preparation of field-effect transistors in accordance with this invention are compatible with monolithic integrated circuit technology and these devices are, therefore, readily incorporated into monolithic circuits.

In the process described above, P type diffusions were used to form the gates and delineate the circular shape of the N type region to form a field-effect transistor having an N type channel. However, a similar but opposite polarity device could be made growing epitaxially a P type region on an N type substrate and then performing the appropriate diffusions to form the desired device geometry. It is intended that the scope of this invention includes such a device. The enhancement diffusion used on the high resistivity N type source and drain regions of the original device to prepare the N+ enhancement regions 35 and 36 would not be needed in making N type gates in an opposite polarity device since the surface concentration of the gate regions would be sufficiently high to prevent the conversion of these regions to P conductivity type by aluminum impurity from the aluminum metallization used to establish the electrodes.

Field effect transistors and current limiters fabricated in accordance with the process of this invention constitute an improvement over the prior art in that they are more stable and have a lower leakage current due to the fact that the silicon dioxide passivating coating provides a field reducing cover at the surface termination points of the PN junctions of these devices. Furthermore, field effect devices fabricated using the above described process have a substantially higher avalanche breakdown voltage than all-diffused structures due to the fact that the low resistivity diffused regions are all adjacent to high resistivity regions of the opposite conductivity type. This latter feature of the present invention insures that there is no N+ P+ junction within the device, e.g., as in an all-diffused structure since all of the PN junctions are formed partially within the relatively high resistivity N type epitaxial semiconductor layer 32.

An advantage of forming an epitaxial channel of relatively high resistivity semiconductor material is that a relatively wide depletion spread may be obtained for a given value of gate voltage. This feature enhances device gain and permits punch through for relatively small values of gate voltage.

A further advantage that the process described above has over an all-diffusion process for making field effect devices is that by first growing an epitaxial layer 32 with a substantially constant impurity profile, it is much easier to control the width of the channel 33 than in an all-diffusion process. For example, when a gate diffusion step is carried out subsequent to the channel diffusion step in the double diffusion process, the two diffusion profiles for the channel and gate are such that it is analogous to striking a moving target in order to arrive at a desired channel width. This analogy can be made due to the fact that there is a substantial gradation in impurity concentration with the depth of the layers which form the channel and gate regions respectively. However, in the process according to this invention, the device gate regions are diffused into a substantially constant impurity concentration epitaxial layer, thereby making it easier to control channel widths.

It is also easier to control channel widths using the epitaxial channel-diffused gate process of this invention than it is an all-epitaxial process, i.e., epitaxial channel-epitaxial gate process. For example, if it is desired to form a channel 33 .25 micron in width, this is best accomplished by first epitaxially growing the N type layer 32 to a thickness in the order of 1 or 1.5 microns and thereafter diffusing the top gate region 31 by a well controlled diffusion process until a desired depth of approximately .25 micron is obtained. When the epitaxial channel-epitaxial gate process is used, an interaction occurs where the P type and N type epitaxial regions meet, and this interaction is referred to as PN junction movement. This junction movement tends to be random in the all-epitaxial structure due to practical impurity content limitations and hence is undesirable in constructing field effect devices in which precise channel width control is desired. For example, it would be much more difficult to first grow an epitaxial channel of .25 micron and thereafter grow a top gate region of .75 or .1 micron than it would be to form the .25 micron epitaxial channel in accordance with the process of this invention.

At some point in the gate diffusion step of the process of this invention, the wafer may be removed from the diffusion furnace, and by electrically probing the diffused region 31, it is possible to determine the depth of the channel 33 by measuring the conductivity thereof. If, for example, too much current is measured for zero gate voltage, this measurement is an indication that the channel region 33 is too wide. Whereupon, the wafer in which the FET is constructed may be returned to the diffusion furnace subsequent to the above measurement in order to increase the depth of the diffused region 31 and correspondingly decrease the width of the channel region 33.

A further significant advantage of combining epitaxial growth and selective solid state diffusion is that epitaxy is best suited for sheet resistance control whereas diffusion is best suited for lateral geometry control. Thus, using the process described above very small field effect devices can be fabricated with a high degree of control over the resistivity and geometry of the source, channel and drain regions thereof.

Obviously, many modifications can be made in the process described above without departing from the scope of this invention. For example, rectangular and other geometries may be substituted for the circular gate geometry if desired. Accordingly, this invention is limited only by way of the following appended claims.

I claim:

1. A method of making a junction field-effect semiconductor device including the steps of:

providing an undiffused wafer of one conductivity type semiconductor material having a relatively high background resistivity, forming a layer to a thickness in the range of 1 to 1.5 microns of opposite conductivity type epitaxial semiconductor material on and coextensive with an undiffused surface of said wafer and forming a first PN junction between said wafer and said epitaxial material, selectively diffusing an impurity of said one conductivity type through said layer of epitaxial material and into said wafer of said one conductivity type to extend said first PN junction to the surface of said epitaxial layer at the periphery of an area of said epitaxial layer inside of a first closed geometrical pattern of said one conductivity type semiconductor material, selectively diffusing an impurity to a respective depth in the range of .75 and 1.25 microns of said one conductivity type in a second closed annular-like geometrical pattern into said area of said epitaxial layer insider of and spaced from said periphery to form a PN junction gate region and to divide said area of said epitaxial layer inside of said periphery into a source region, a drain region, and a channel region, integral with said source region and said drain region, measuring the conductivity of said channel region as a control of its width, diffusing an enhancement impurity region of said opposite conductivity type into each of said source and drain regions, forming source and drain contact means on the enhancement impurity regions of said source and drain regions, respectively, and forming contact means on said gate region.

2. The invention according to claim 1 wherein the background resistivity of said undiffused wafer is of the order of one ohm-centimeter.

3. The invention according to claim 1 wherein the first closed geometrical pattern is a circle and the second closed geometrical pattern is an annulus.

4. The invention according to claim 1 wherein the initial thickness of said epitaxial layer is within the range of 1 to 5 microns and the depth of diffusion of said second closed geometrical pattern is within the range of .75 to 3 microns.

5. A method of making a junction field-effect transistor device including the steps of:

providing an undiffused wafer of P conductivity type silicon having a background resistivity of the order of one ohm-centimeter, forming a layer of N conductivity type epitaxial silicon on and coextensive with an undiffused surface of said wafer and having a thickness in the range of 1 to 5 microns and forming a first PN junction between said wafer and said epitaxial material, selectively diffusing boron through said layer of epitaxial material and into said wafer of said N conductivity type to extend said first PN junction to the surface of said epitaxial layer and to define an area of said epitaxial layer inside of a circle of said P conductivity type silicon, selectively diffusing boron having a surface concentration of about $10^{20}$ atoms per cubic centimeter as an annulus into said circle of said epitaxial layer to a respective depth within the range of .75 to 3 microns to form a PN junction gate region and to divide said circle of said epitaxial layer into a source region, a drain region, and a channel region, measuring the conductivity of said channel region as a control of its width, diffusing an enhancement impurity region of N conductivity type into each of said source and drain regions, forming source and drain contact means on the enhancement impurity regions of said source and drain regions, respectively, and forming contact means on said gate region.

References Cited

UNITED STATES PATENTS

| | | | |
|---|---|---|---|
| 3,018,391 | 1/1962 | Lindsay et al. | 317—235UX |
| 3,112,411 | 11/1963 | Cook et al. | 317—235UX |
| 3,210,677 | 10/1965 | Lin et al. | 317—235UX |
| 3,114,867 | 12/1963 | Szekely | 317—235 |
| 3,204,160 | 8/1965 | Sah | 317—235 |
| 3,275,910 | 9/1966 | Phillips | 317—235 |
| 3,275,911 | 9/1966 | Onodera | 317—235 |
| 3,293,087 | 12/1966 | Porter | 148—175 |
| 3,319,311 | 5/1967 | Mutter | 148—187X |
| 3,346,786 | 10/1967 | Parmer | 317—235 |
| 3,349,474 | 10/1967 | Rauscher | 29—574 |
| 3,405,330 | 10/1968 | Hilbiber | 317—235 |
| 3,410,735 | 11/1968 | Hackley | 148—187X |
| 3,412,460 | 11/1968 | Lin | 148—187X |
| 3,183,128 | 5/1965 | Leistiko et al. | 148—186 |
| 3,223,904 | 12/1965 | Warner et al. | 148—175X |
| 3,243,669 | 3/1966 | Sah | 317—234 |
| 3,260,902 | 7/1966 | Porter | 317—235 |

L. DEWAYNE RUTLEDGE, Primary Examiner

W. G. SABA, Assistant Examiner

U.S. Cl. X.R.

29—571; 117—201; 148—186; 317—235